United States Patent [19]

Collins et al.

[11] Patent Number: 5,349,313
[45] Date of Patent: Sep. 20, 1994

[54] VARIABLE RF POWER SPLITTER

[75] Inventors: Kenneth S. Collins; John R. Trow; Craig A. Roderick, all of San Jose, Calif.

[73] Assignee: Applied Maetrials Inc., Santa Clara, Calif.

[21] Appl. No.: 140,338

[22] Filed: Oct. 22, 1993

Related U.S. Application Data

[63] Continuation of Ser. No. 977,353, Nov. 17, 1992, abandoned, which is a continuation-in-part of Ser. No. 825,658, Jan. 23, 1992, Pat. No. 5,187,454.

[51] Int. Cl.$^5$ ............................................. H03H 7/38
[52] U.S. Cl. ................................... 333/131; 333/100
[58] Field of Search ................ 333/100, 17.3, 32, 124, 333/131, 99 PC

[56] References Cited

U.S. PATENT DOCUMENTS

| | | | |
|---|---|---|---|
| 3,611,016 | 3/1970 | Rogers | 333/7 |
| 3,891,947 | 5/1975 | Debost et al. | 333/17 |
| 4,626,312 | 12/1986 | Tracy | 156/345 |
| 4,680,559 | 7/1987 | Swanson | 333/100 |
| 4,823,096 | 4/1989 | Hash | 333/109 |
| 4,871,421 | 10/1989 | Ogle et al. | 156/345 |
| 4,887,005 | 12/1989 | Rough et al. | 315/111.21 |
| 4,951,009 | 8/1990 | Collins | 333/17.3 |
| 4,983,865 | 1/1991 | Ho et al. | 333/103 |
| 5,187,454 | 1/1992 | Collins et al. | 333/17.3 |

*Primary Examiner*—Robert J. Pascal
*Assistant Examiner*—Darius Gambino
*Attorney, Agent, or Firm*—Michael A. Glenn

[57] ABSTRACT

A variable RF power splitter including three serially connected inductors (14, 15, 16) powered by an RF power source (11, 12). Two loads (17, 18), between which the RF power is to be split, are connected to ground from two different points in the inductance string. A variable reactance (19) connected to ground from another point in the inductance string controls the RF power splitting.

15 Claims, 7 Drawing Sheets

VARIABLE RF POWER SPLITTER

RELATED APPLICATIONS

This application is a continuation of Ser. No. 07/977,353, filed 7 November 1992 and now abandoned, which is a continuation-in-part of Ser. No. 07/825,658, filed Jan. 23, 1992, now issued as U.S. Pat. No. 5,187,454.

BACKGROUND OF THE INVENTION

1. Field of the Invention

The present invention relates to RF power splitter apparatus for splitting a radio frequency (RF) electrical signal between two loads, and, more specifically, to an RF power splitter which permits adjusting the ratio of the RF voltage applied to the two loads.

2. Description of the Prior Art

There are many applications in which it is desirable to be able to divide a high power RF signal between two loads and adjust the ratio of voltage applied to the two loads. In some applications, it is important that the voltage split ratio and phase differential between the two outputs of the splitter be substantially independent of changes in impedance of the two loads. For example, when an RF power splitter is used to supply power to two electrodes of a plasma reaction chamber, the impedance of the plasma varies dynamically as a function of changing operating conditions such as gas pressure in the chamber, temperature, and RF power level. To maximize the stability of the plasma, the two output voltages of the RF power splitter should have as little sensitivity as possible to changes in the two load impedances it is driving.

Examples of plasma reactors having RF power splitters for supplying power to two electrodes are U.S. Pat. No. 4,871,421 granted Oct. 3, 1989 to Ogle et al. for a "Split Phase Driver for Plasma Etch System", and U.S. Pat. No. 4,887,005 granted Dec. 12, 1989 to Rough et al. for a "Multiple Electrode Plasma Reactor Power Distribution System".

Known RF power splitters include RF transformers in which wipers or multiple taps permit adjustment of the voltage split ratio. However, this requires the use of mechanical switch contacts or wipers which suffer deterioration over time.

Other known RF power splitters consist of networks of inductors and capacitors in which one or more of the inductors or capacitors is variable so as to adjust the ratio of voltage applied to two loads. However, in known networks of this type, the voltage split ratio and the phase differential between the two output signals generally are very sensitive to the impedances of the loads. Also, in such networks the relative phase angle between the two output signals changes substantially as the power split ratio is varied.

There is a need for an RF power splitter which can adjust the ratio of voltage applied to two loads over a wide range without imposing excessive changes in the relative phases of the two output signals and with minimal sensitivity to changes in the impedances of the two loads.

SUMMARY OF THE INVENTION

The present invention is an RF power splitter which permits adjusting the ratio of voltage applied to two loads. The present invention can be adjusted so that the output signals maintain a relatively constant phase relationship as the voltage ratio between the two output signals is adjusted, and so that the voltage split ratio is relatively unaffected by dynamic changes in the impedances of the two loads.

Specifically, the novel RF power splitter comprises three mutually coupled inductors connected in series so that the first inductor is connected between a first terminal and a second terminal, the second inductor is connected between the second terminal and a third terminal, and the third inductor is connected between the third terminal and a fourth terminal. The RF power input is connected between one of the four terminals and a fifth terminal, referred to as the ground terminal. A variable reactance is connected between a different one of the first four terminals and the ground terminal. The first and second loads are respectively connected between the first and second of the remaining two terminals and the ground terminal.

In operation, adjusting the variable reactance changes the ratio of voltage provided to the two loads. To avoid any need for mechanical moving parts, the variable reactance can be a fixed capacitor in series with a saturable inductor whose inductance is controlled by an electrical control current.

DETAILED DESCRIPTION OF THE PREFERRED EMBODIMENTS

Figure 1:
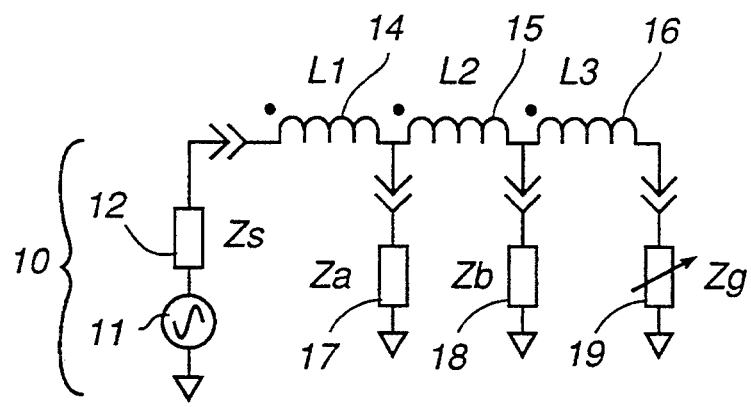
FIGS. 1 and 2 are electrical schematics of first and second alternative embodiments of the RF power splitter of the present invention.

FIG. 1 is an electrical schematic of the first of two preferred embodiments of an RF power splitter according to the present invention. An RF signal is provided by an RF power source 10 which is modelled in the schematic as an ideal RF voltage source 11 in series with a source impedance 12 whose complex value is represented as $Z_s$. The power source is connected to one end of first inductor 14, which in turn is connected in series with second and third inductors 15 and 16, respectively. The three inductors 14–16 are mutually coupled and are series-connected in phase. In FIG. 1, a dot at one end of each inductor represents inductor terminals having common phase. Preferably, the mutual coefficient of coupling among the three inductors is as high as possible, and is roughly 0.8 in the preferred embodiment.

The first load 17 is represented as having a complex impedance $Z_a$ and is connected at one end to the junction of the first and second inductors and at the other end to the ground terminal of the RF power source 10. Similarly, the second load 18 having complex impedance $Z_b$ is connected between the junction of the second and third inductors and ground. Lastly, a variable reactance 19 having complex impedance $Z_g$ is connected between the otherwise unconnected end of the third inductor 16 and ground.

In operation, the RF voltage provided by the RF power source 10 is coupled through the RF power splitter network to the two loads 17 and 18. The ratio of voltage supplied to the two loads may be adjusted by varying the reactance of variable reactance 19.

Figure 2:
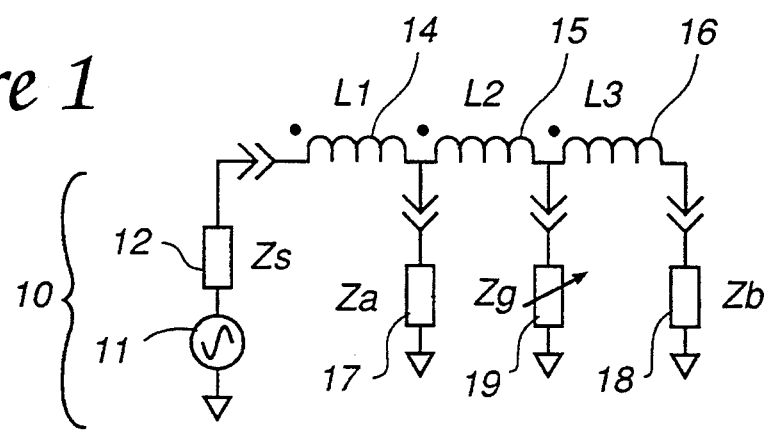

FIG. 2 shows an alternative but equally preferred implementation of the RF power splitter which is identical to the embodiment shown in FIG. 1 except that the second load 18 and the variable reactance 19 are interchanged. The difference in performance of these two implementations will be analyzed below.

Figure 3:
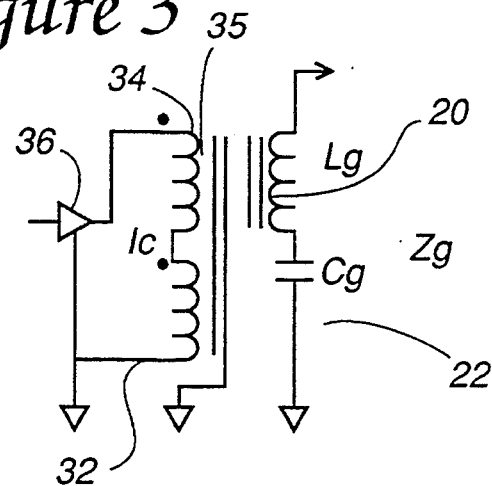
FIG. 3 is an electrical schematic of a conventional variable inductor which is the preferred implementation of the variable reactance in the RF power splitters shown in FIGS. 1 and 2.
Figure 4:
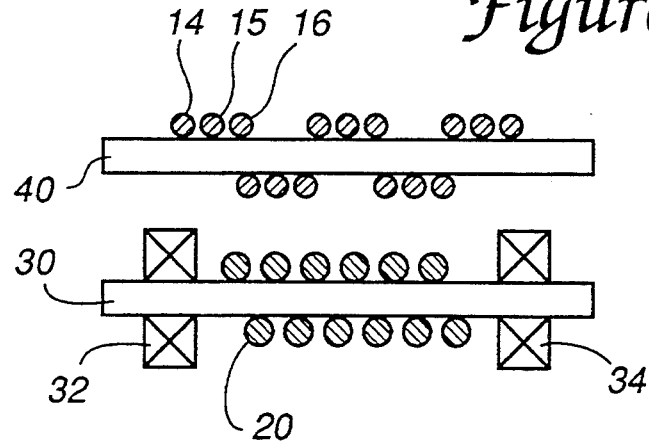
FIG. 4 is a sectional view of the inductors used to implement the power splitters of FIGS. 1 and 2.

FIGS. 3 and 4 show the preferred implementation for the variable reactance 19. It is a fixed capacitor 22 (having capacitance $C_g$) connected in series with a conventional saturable inductor 20 (having inductance $L_g$) in which an electrical control signal controls the value of an inductor. A detailed description of such a variable inductor appears in commonly assigned U.S. Pat. No. 4,951,009 by Kenneth S. Collins, one of the inventors of the present invention. That patent is hereby incorporated by reference into this description in its entirety. In particular, preferred implementations of the variable inductor 20 are described in FIGS. 8–11 of the patent and the corresponding text.

Referring to FIGS. 3 and 4, variable inductor 20 is wound around a saturable (i.e., non-linear) ferromagnetic core 30. Also wound around core 30 is a control winding, which preferably is implemented as two control windings 32 and 34, interconnected in series or in parallel, which are wound on opposite ends of core 30 with inductor winding 20 between them, as shown in FIG. 4. The magnetic properties of saturable core 30 and the number of windings of each of the three coils 20, 32, and 34 are chosen so that the inductance of inductor 20 can be adjusted by varying the current through the control windings 32 and 34, but will not be affected by variations in the current through inductor 20 at the intended RF power levels. A conventional amplifier 36 can be used to control the current through the control windings to adjust the value of inductor 20. This electrical control system avoids any need for mechanical devices to adjust the power split ratio of the RF power splitter.

Preferably, the variable inductor 20 ($L_g$) and fixed capacitor 22 ($C_g$) have values chosen so that, at the midpoint of the adjustment range for the inductor 20, the series resonance frequency of the variable reactance 19 ($Z_g$) equals the frequency of the RF power source 10. Accordingly, as the inductance of inductor 20 is adjusted to values lower and higher than this midpoint, the reactance 19 ranges from capacitive (negative reactance) to inductive (positive reactance).

Although variable reactance 19 alternatively could be implemented as a fixed inductor in series with a conventional variable capacitor having a mechanically adjustable rotor plate, it is preferable to avoid the use of moving parts so as to avoid problems of mechanical wear.

FIG. 4 also shows the preferred implementation of the three mutually coupled inductors 14, 15 and 16. To maximize their mutual coefficient of inductive coupling, they are constructed as a trifilar winding on a ferromagnetic core 40. This core 40 is not magnetically coupled to saturable core 30. They are shown adjacent to each other in FIG. 4 because that is an actual preferred physical implementation.

To demonstrate the performance of the present invention, RF power splitters according to the first embodiment shown in FIG. 1 and the second embodiment shown in FIG. 2 were modelled on a computer. The RF power source 10 was assumed to have a 1.8 MHz frequency and a 50 ohm source impedance $Z_s$. The three mutually coupled inductors 14, 15 and 16 were each assumed to have a self inductance ($L_1$, $L_2$ and $L_3$) of 1.5 microhenries and a pairwise coefficient of coupling ($K_{12}$, $K_{23}$ and $K_{13}$) of 0.8.

Figure 5:
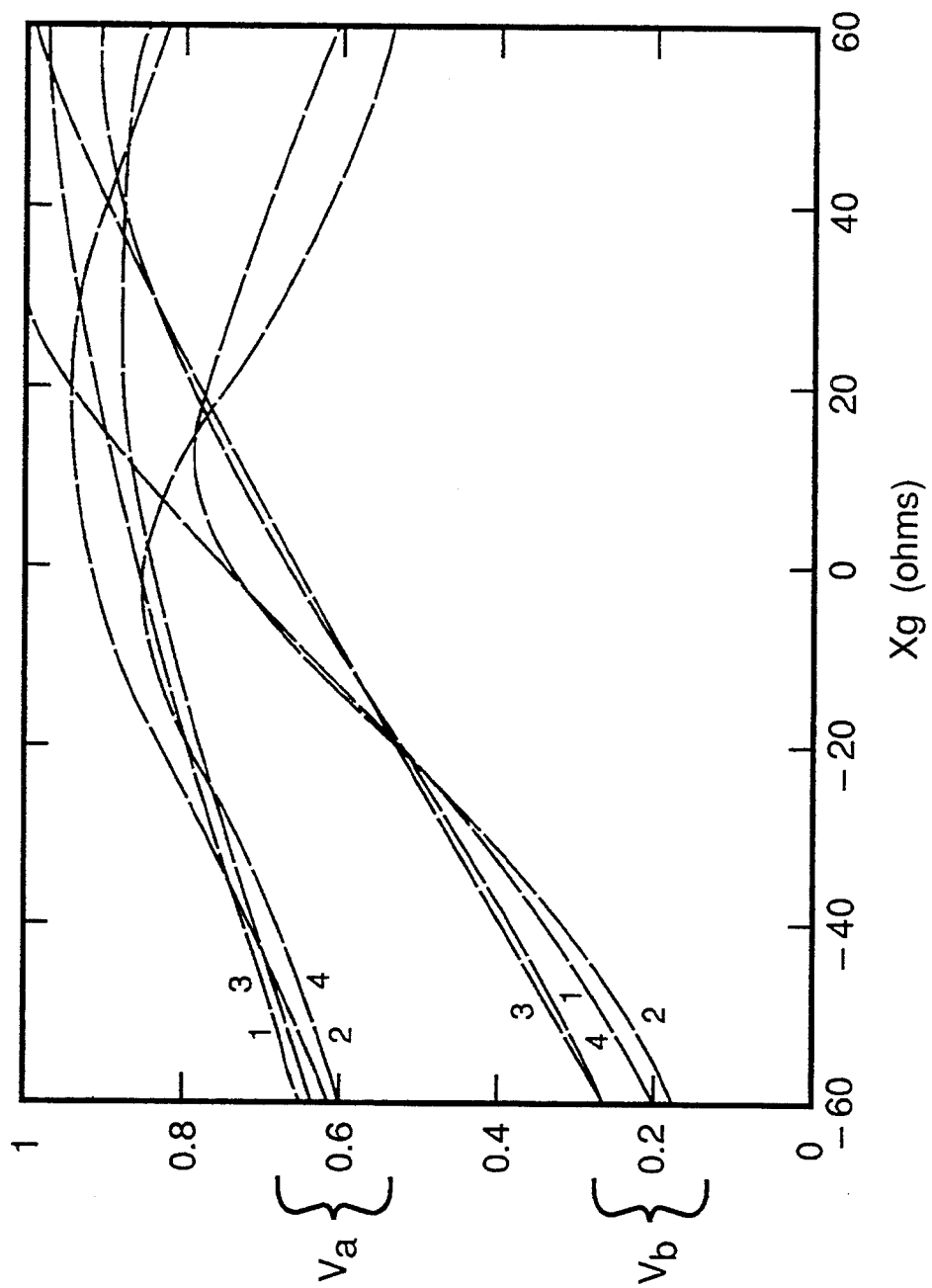
FIG. 5 is a graph of the magnitudes of both output voltages as a function of the value of the variable inductor in the first embodiment of the power splitter. The voltages in the graph are normalized, assuming a one volt rms input from the RF voltage source.
Figure 6:
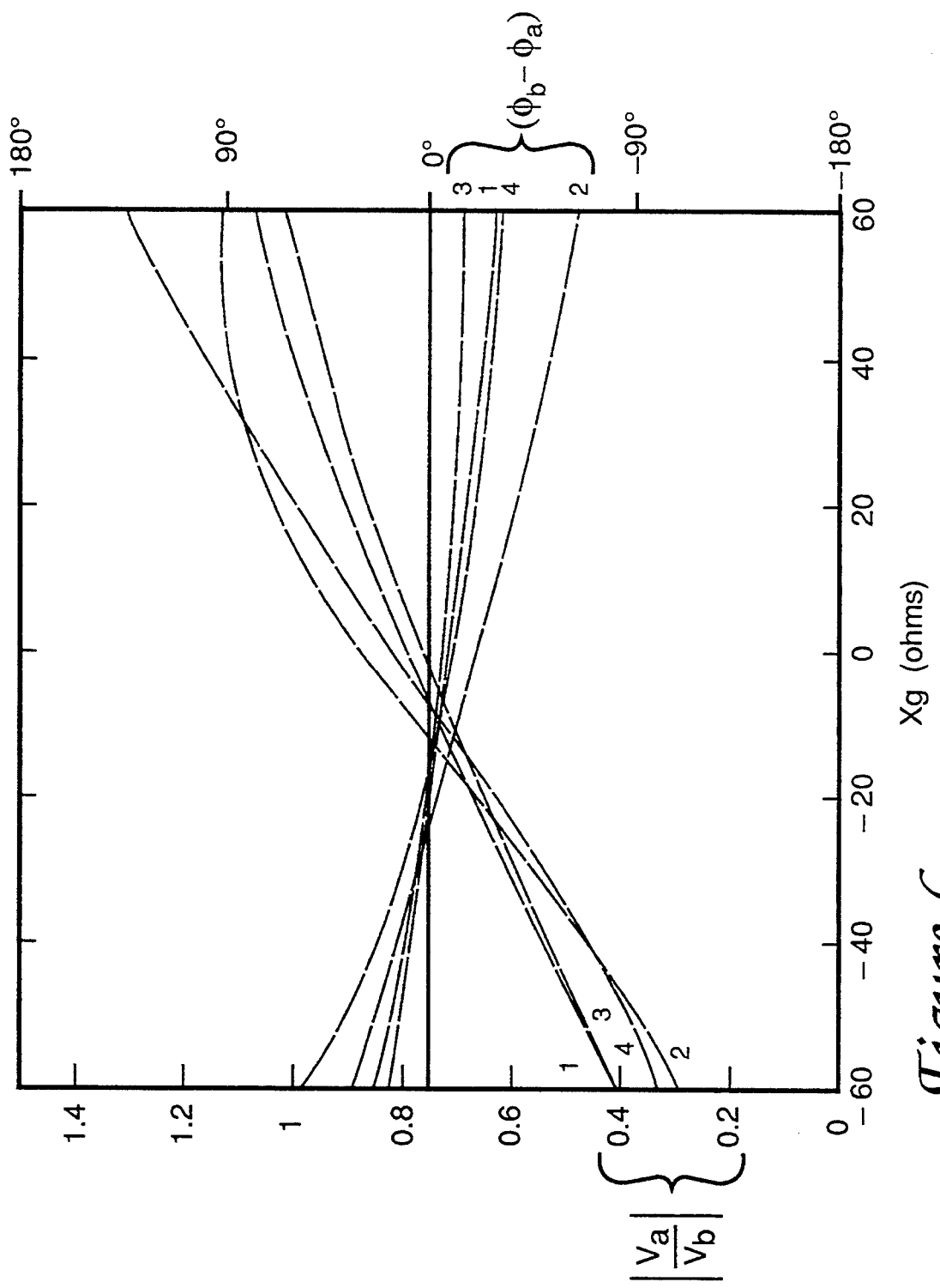
FIG. 6 is a graph of the magnitude ratio and phase difference between the two output voltages as a function of the value of the variable inductor in the first embodiment of the power splitter.
Figure 7:
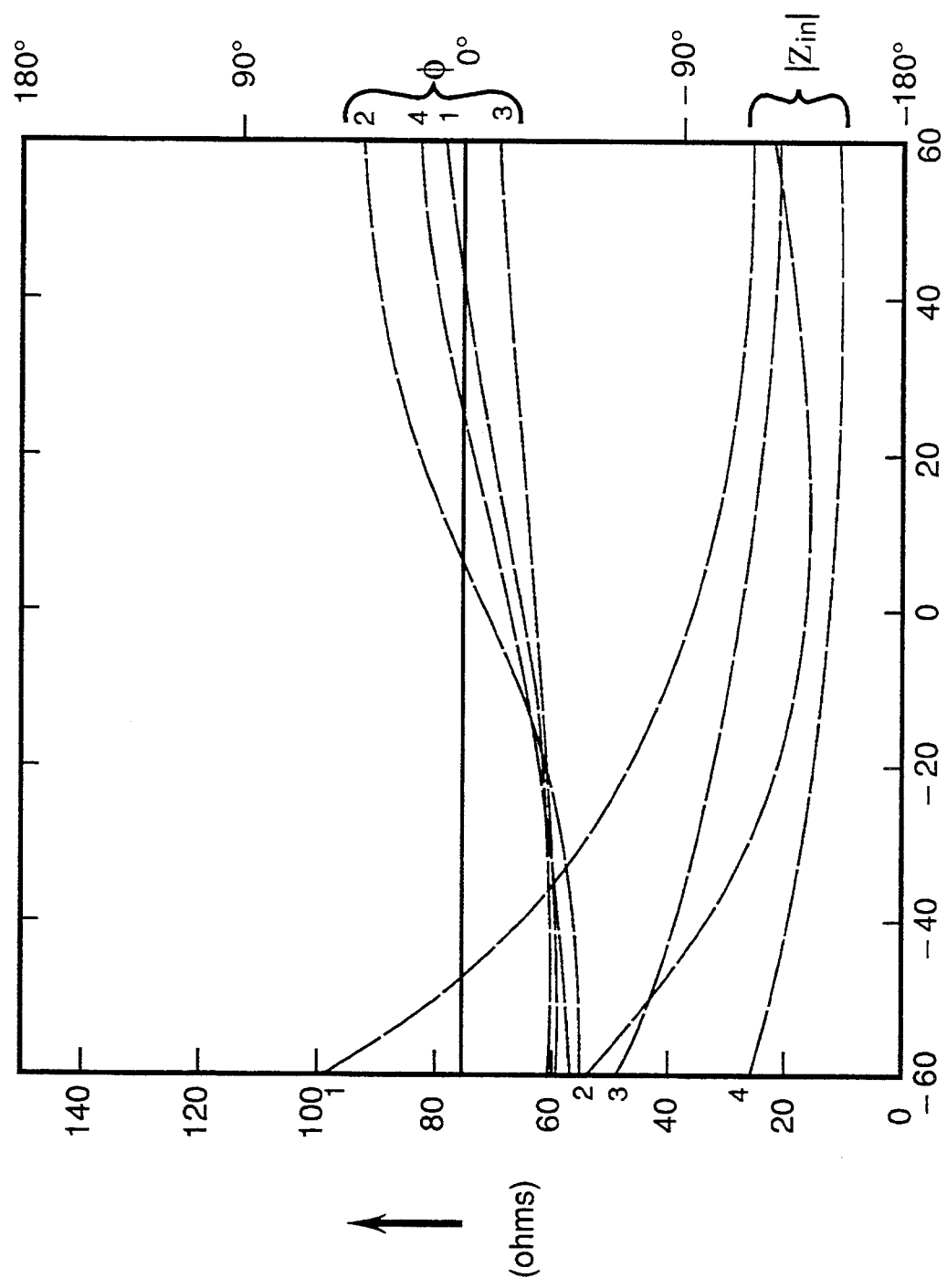
FIG. 7 is a graph of the magnitude and phase of the input impedance of the first embodiment of the RF power splitter as a function of the value of the variable inductor.
Figure 8:
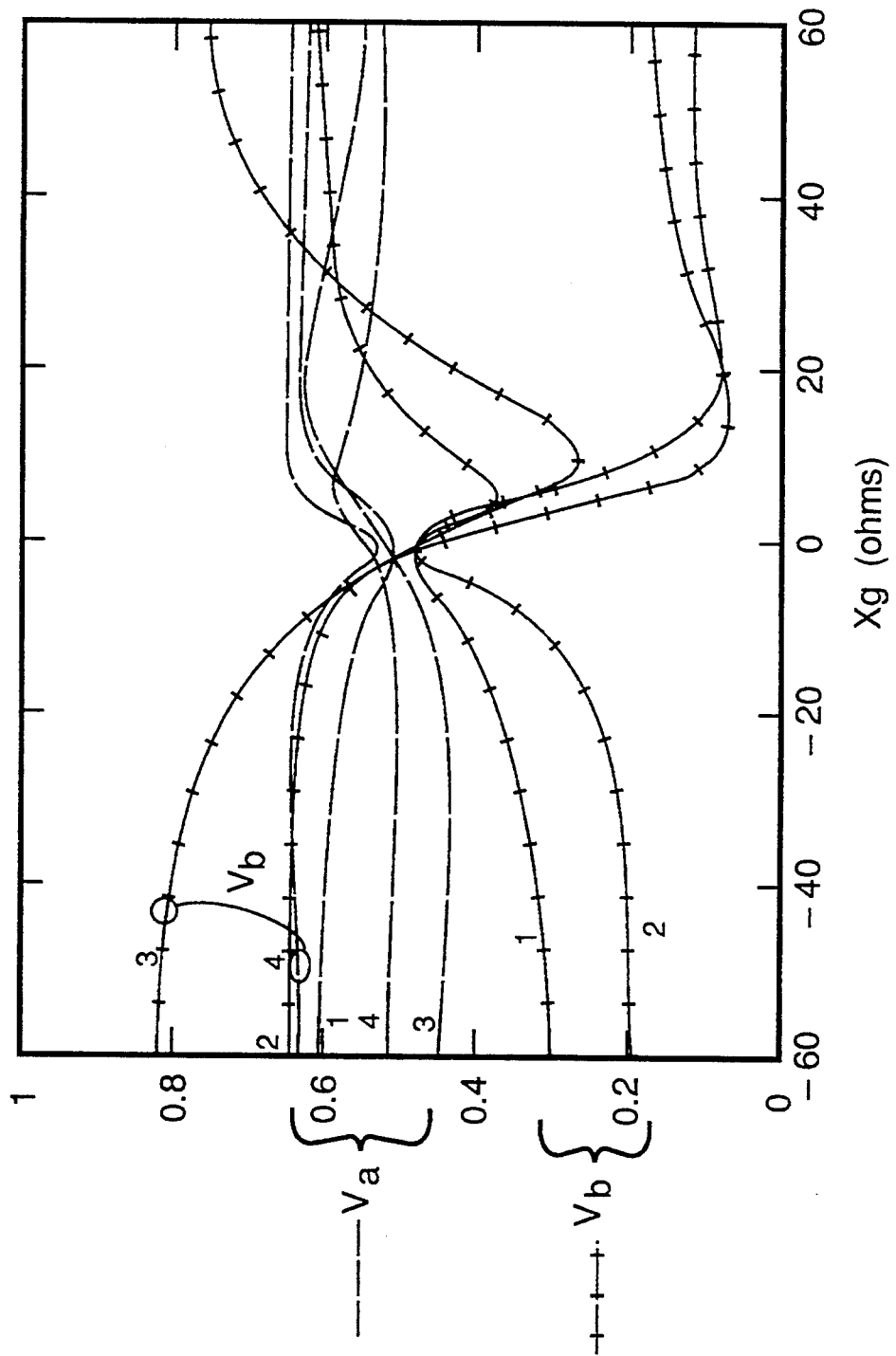
FIGS. 8–10 are graphs corresponding to FIGS. 5–7, respectively, for the second embodiment of the RF power splitter.
Figure 9:
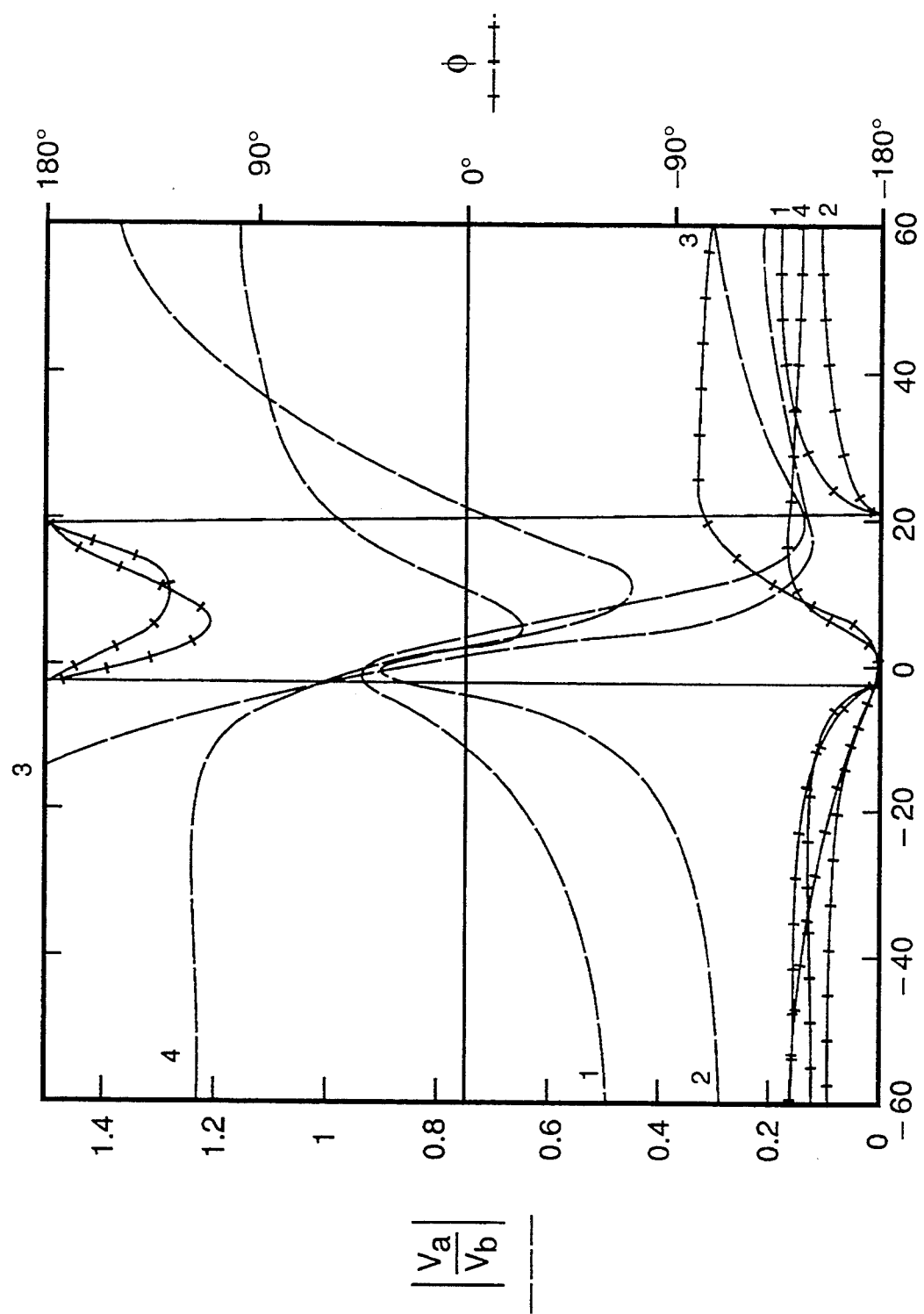
Figure 10:
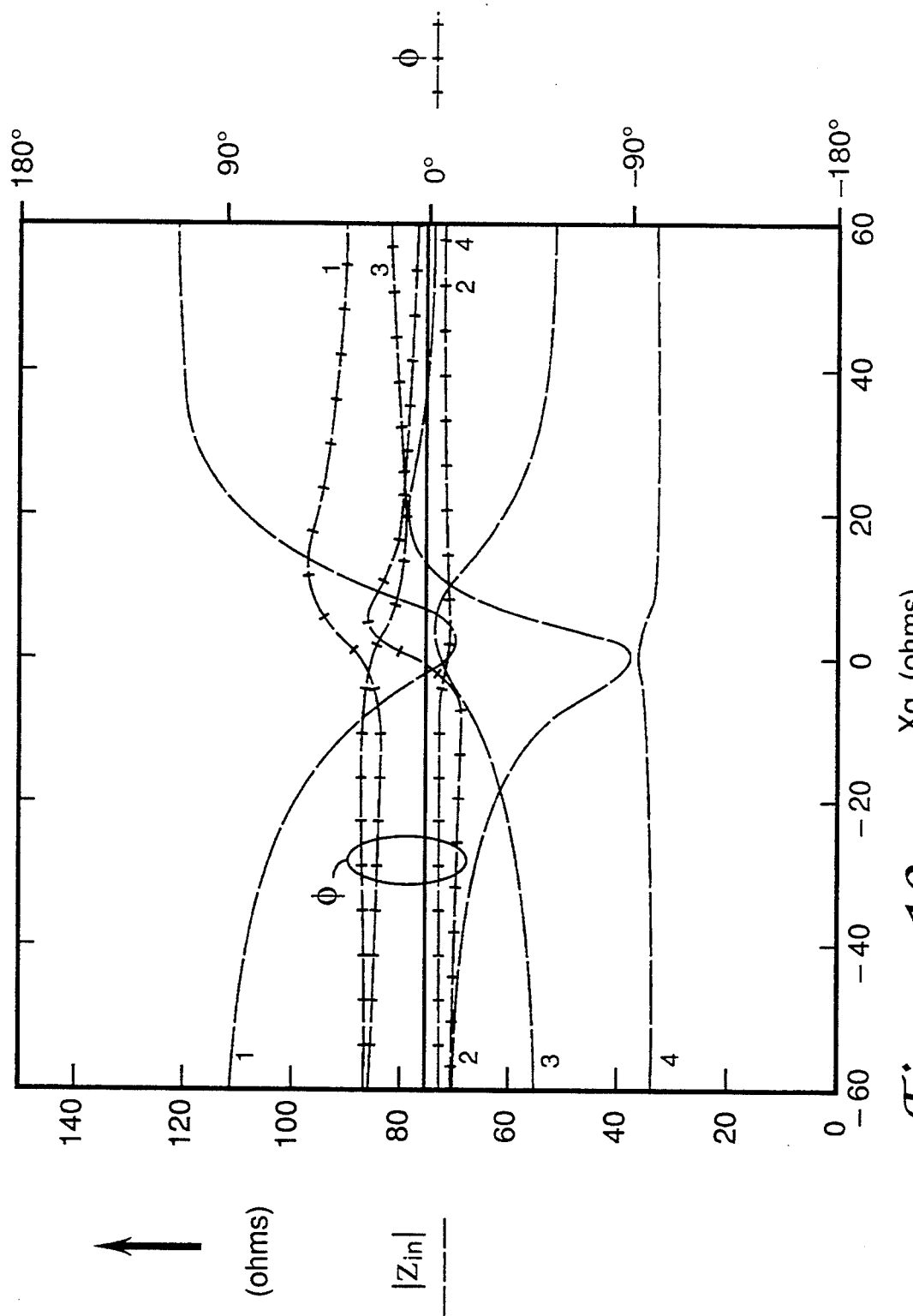

FIGS. 5–7 show the results for the computer model of the FIG. 1 embodiment, and FIGS. 8–10 correspond to the FIG. 2 embodiment.

In each graph the horizontal axis depicts the value of variable reactance 19 being varied from $-60$ ohms to $+60$ ohms (where negative and positive reactances represent capacitance and inductance, respectively). In the mathematical model from which these graphs were produced, the inductor 20 was assumed to have a DC resistance of 0.6 ohms.

To illustrate the relative independence of the output power split ratio and phase differential as a function of load impedance, each graph includes four numbered curves representing different load impedances. In each case, the loads are assumed to be capacitive with an impedance phase angle of $-45°$. Such a load impedance is a good model of the impedance of the plasma sheath, assuming the RF power splitter is being used to drive two electrodes in a plasma chamber. To model the sensitivity of the voltage split ratio to changes in the two load impedances respectively connected to the two outputs of the RF power splitter, four curves were computed for four combinations of load impedances as follows:

Curve 1: $|Z_a| = 52\ \Omega$; $|Z_b| = 21\ \Omega$.

Curve 2: $|Z_a| = 26\ \Omega$; $|Z_b| = 10.6\ \Omega$.

Curve 3: $|Z_a| = 21\ \Omega$; $|Z_b| = 52\ \Omega$.

Curve 4: $|Z_a| = 10.6\ \Omega$; $|Z_b| = 26\ \Omega$.

With respect to the first embodiment shown in FIG. 1, FIGS. 5 and 6 show that the voltage split ratio and phase differential remain fairly independent of load impedance (i.e., the four curves are close together) when variable inductor 19 is adjusted over a range which causes the voltage supplied to the first load 17 ($Z_a$) to range from 30% to 100% of the voltage to the second load 18 ($Z_b$). Also, FIG. 6 shows that the phase differential remains within $\pm 45°$ when the power split ratio is adjusted within this range. This is better constancy than was obtainable with prior art LC power splitter networks. FIG. 7 shows the input impedance of the RF power splitter over the same range of conditions.

With respect to the second embodiment shown in FIG. 2, FIGS. 8 and 9 show that the sensitivity of the voltage split ratio to changes in load impedance is greater (i.e., worse) than in the first embodiment. However, the second embodiment maintains a more constant phase differential between the two output signals when either the power split ratio or the load impedances are varied. Therefore, which embodiment is preferable depends whether it is more important in a given application to maintain a constant relative amplitude or a constant relative phase differential between the two output signals. FIG. 10 shows the input impedance for the second embodiment over the same range of conditions.

Although only two embodiments have been described, it is clear that additional embodiments can be constructed by interchanging the four components connected to the three mutually coupled inductors, that is, by interchanging the connection points of the power source 10, the two output loads 17 and 18, and the variable reactance 19. For example, in FIG. 2 the power source 10 could be interchanged with either the first output load 17 or the variable reactance 19. In addition, any of the three inductors 14–16 can be reversed end-to-end to alter the phase relationships of the output signals.

As demonstrated by the preceding description, an RF power splitter having the novel LC network topology of the present invention which incorporates three mutually coupled inductors and a variable reactance has performance attributes not found in the prior art. Specifically, it is superior when dynamically varying loads, such as a plasma in a reaction chamber, must be driven while maintaining an output voltage split ratio and phase differential which is relatively independent of fluctuating load impedance. It also permits the voltage split ratio be adjusted over a wide range with minimal variation in the phase angle between the output signals. Lastly, it is suitable for implementation without mechanical moving parts or switch contacts.

We claim:

1. An adjustable RF power splitter for coupling power received at an input terminal to two output terminals, wherein the ratio of RF voltage to the two outputs is adjustable, comprising:
    first, second, and third mutually coupled inductors connected in series so that the first inductor is connected between a first electrical junction and a second junction, the second inductor is connected between the second junction and a third junction, and the third inductor is connected between the third junction and a fourth junction;
    an input terminal and a reference terminal adapted for receiving an RF power input signal therebetween, the input terminal being connected to one of the four junctions;
    a variable reactance whose impedance is adjustable over a range, the variable reactance being connected between one of the other three junctions and the reference terminal;
    a first output terminal connected t one of the other two junctions; and
    a second output terminal connected to the remaining junction;
    whereby first and second output voltages are produced between the first and second output terminals, respectively, and the reference terminal, and whereby adjusting the variable reactance operates to vary the ratio between the first and second voltages.

2. A power splitter according to claim 1, wherein the junction to which the input terminal is connected is the first junction.

3. A power splitter according to claim 1, wherein the first, second, and third inductors are constructed by winding first, second, and third coils, respectively, around a common ferromagnetic core.

4. A power splitter according to claim 1, wherein the variable reactance resonates at the frequency of the RF input signal when the variable reactance is adjusted to a point near the middle of its adjustment range, whereby the variable reactance can be adjusted to a capacitive impedance at one end of its adjustment range and to an inductive impedance at the opposite end of its adjustment range.

5. A power splitter according to claim 4, wherein the variable reactance comprises a fixed inductor in series with a variable capacitor.

6. A power splitter according to claim 4, wherein the variable reactance comprises a fixed capacitor in series with a variable inductor.

7. A power splitter according to claim 6, wherein the variable inductor comprises a coil wound on a nonlinear ferromagnetic core, and wherein a magnetic field of adjustable intensity is applied to the nonlinear core to adjust the inductance of the variable inductor.

8. A power splitter according to claim 1, where said first, second, and third mutually coupled inductors have values of pairwise mutual coefficients of coupling $K_{12}$, $K_{13}$, and $K_{23}$ therebetween of at least 0.8.

9. An RF power splitter, comprising:
    first, second, and third mutually coupled inductors connected in series, the first inductor connected between a first terminal and a second terminal, the second inductor connected between the second terminal and a third terminal, and the third inductor connected between the third terminal and a fourth terminal;
    an RF power input signal connected between one of said four terminals and a reference terminal;
    a first and a second load, each load connected between a different one of the other three terminals, respectively, and said reference terminal; and
    a variable reactance connected between a remaining one of the four terminals and said reference terminal, said variable reactance being operable to vary the voltage ratio between the first load and the second load.

10. A power splitter according to claim 9, wherein the junction to which the input signal is connected is the first junction.

11. A power splitter according to claim 9, wherein the first, second, and third inductors are constructed by winding first, second, and third coils, respectively, around a common ferromagnetic core.

12. A power splitter according to claim 9, wherein the variable reactance resonates at the frequency of the RF input signal when the variable reactance is adjusted to a point near the middle of its adjustment range, whereby the variable reactance can be adjusted to a capacitive impedance at one end of its adjustment range and to an inductive impedance at the opposite end of its adjustment range.

13. A power splitter according to claim 12, wherein the variable reactance comprises a fixed inductor in series with a variable capacitor.

14. A power splitter according to claim 12, wherein the variable reactance comprises a fixed capacitor in series with a variable inductor.

15. A power splitter according to claim 14, wherein the variable inductor comprises a coil wound on a nonlinear ferromagnetic core, and wherein a magnetic field of adjustable intensity is applied to the nonlinear core to adjust the inductance of the variable inductor.

* * * * *